United States Patent [19]
Dabiri

[11] Patent Number: 6,009,446
[45] Date of Patent: Dec. 28, 1999

[54] METHOD AND APPARATUS FOR DIGITAL FILTRATION OF SIGNALS

[75] Inventor: Dariush Dabiri, Fremont, Calif.

[73] Assignee: LSI Logic Corporation, Milpitas, Calif.

[21] Appl. No.: 09/018,185

[22] Filed: Feb. 4, 1998

[51] Int. Cl.[6] .................................................. G06F 17/10
[52] U.S. Cl. .......................................... 708/300; 708/313
[58] Field of Search .................................. 708/300, 301, 708/308, 313, 316, 319, 401, 402, 403, 404, 405

[56] References Cited

U.S. PATENT DOCUMENTS

| | | | |
|---|---|---|---|
| 4,388,693 | 6/1983 | Nakayama | 708/301 |
| 4,550,415 | 10/1985 | Debus, Jr. et al. | 375/234 |
| 5,097,331 | 3/1992 | Chen et al. | 348/398 |
| 5,323,391 | 6/1994 | Harrison | 370/210 |
| 5,496,964 | 3/1996 | Suzuki | 84/660 |

*Primary Examiner*—Chuong Dinh Ngo

[57] ABSTRACT

Digital filtration is accomplished by splitting the incoming signal into phases. Each phase is then converted into a weighted sum reflecting the design of a prototype filter. Then the data is again split into phases at which time specific points may be interpolated and the data accumulated until a filtered signal has resulted. All of the steps can be easily modified after manufacture so that the filtration can handle variable bandwidth systems at low data rates, as well as implement a wide variety of filtering structures.

23 Claims, 4 Drawing Sheets

METHOD AND APPARATUS FOR DIGITAL FILTRATION OF SIGNALS

BACKGROUND OF THE INVENTION

1. Field of the Invention

The present invention relates to the filtration of signals. More specifically, the present invention relates to a method and an apparatus for digital filtration of signals.

2. The Prior Art

Filtration of signals is used in a variety of different applications. Filters work by responding differently to signals of different frequency. FIG. 1 depicts an example of a signal graphed by magnitude and frequency. This wave is then altered in some way by a filter. Different filters perform different operations on the wave.

FIGS. 2A–2C depict examples of the effects of different filters on the wave in FIG. 1. A common type of filter is one which changes the shape of a wave. An example of the effect of such a filter is depicted in FIG. 2A. Filters can be designed to alter the shape of waves in many different ways. Another common type of filter is a rejection filter, where a portion or portions of the signal is disregarded in favor of another portion. This usually takes the form of rejection based on frequency. An example of the effect of this type of filter is depicted in FIG. 2B. As one can see, the portions of the signal below frequency a and above frequency b have been reduced to zero magnitude, while the portion of the signal between frequencies a and b has been left unchanged.

Another type of filter commonly used is known as a lowpass filter. A lowpass filter filters out portions of the signal with higher than a specific frequency, only allowing the portions of the signal below that specific frequency to pass (hence the name lowpass). An example of the effect of such a filter is depicted in FIG. 2C. As one can see, the portion of the signal above frequency a has been rejected, while the portion under frequency a has been allowed to pass. These are just a few of the many different types of filters known in the prior art.

Variable bandwidth systems are those in which certain information is contained in blocks of frequency (or channels) which have different bandwidths. The simplest way to think of these systems is as a television broadcast system. FIG. 3 depicts a television broadcast system in which all of the channels have the same bandwidth capacity. This is known as a fixed bandwidth system. FIG. 4 depicts a television broadcast system in which the channels may have different bandwidths. This is known as a variable bandwidth system. The advantage of a variable bandwidth system is that it provides more flexibility in setting up the system. In the specific example of television broadcasting, a system could be set up where certain channels have higher bandwidth (allowing for more information) while other channels have lower bandwidths. The channels with higher bandwidth could be used to transmit stations that contain a lot of information (such as movie channels, where picture and sound quality should be the best). The channels with lower bandwidth could be used to transmit stations that contain less information (such as news channels, or audio only channels, where picture and/or sound quality need not be of the highest quality).

A problem arises, however, in filtering signals in variable bandwidth systems. Most prior art filters are hardwired to filter a certain way. Therefore, most individual prior art filters can only handle fixed bandwidth systems. A variable bandwidth filter can be constructed for a fixed data rate system (a system where the input rate of data never can be changed) by having a construction where it is possible to alter the sampling frequency of the input signal, which in turn would alter the bandwidth of the filter. However, the problem with this is that one cannot lower the sampling frequency below the Nyquist rate (twice the Nyquist frequency, which is the highest input signal frequency) because when the sampling frequency falls below the Nyquist rate, aliasing occurs. Aliasing results in frequencies greater than one-half the sampling rate becoming indistinguishable from frequencies in the fundamental bandwidth (between DC and one-half the sampling rate). Thus, for systems with low bandwidths, which can be quite common, it is necessary to use a plurality of filters to perform the task of one filter.

For example, in a variable bandwidth system with a low data rate where the possible bandwidth sizes are 1 MHz, 2 MHz, and 3 MHz, if one wanted to set up a lowpass filter for the incoming signal, one would have to actually have 3 lowpass filters, one for 1 MHz bandwidths, one for 2 MHz bandwidths, and one for 3 MHz bandwidths. This increase in complexity takes up extra space in a system as well as costs extra money.

What is needed is a way to implement a wide range of filters with one single structure, which is capable of performing filtering in systems with low bandwidths and has the flexibility to work under varying sampling frequencies.

BRIEF DESCRIPTION OF THE INVENTION

Digital filtration is accomplished by splitting the incoming signal into phases. Each phase is then converted into a weighted sum reflecting the design of a prototype filter. Then the data is again split into phases at which time specific points may be interpolated and the data accumulated until a filtered signal has resulted. All of the steps can be easily modified after manufacture so that the filtration can handle variable bandwidth systems at low data rates, as well as implement a wide variety of filtering structures.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 5:
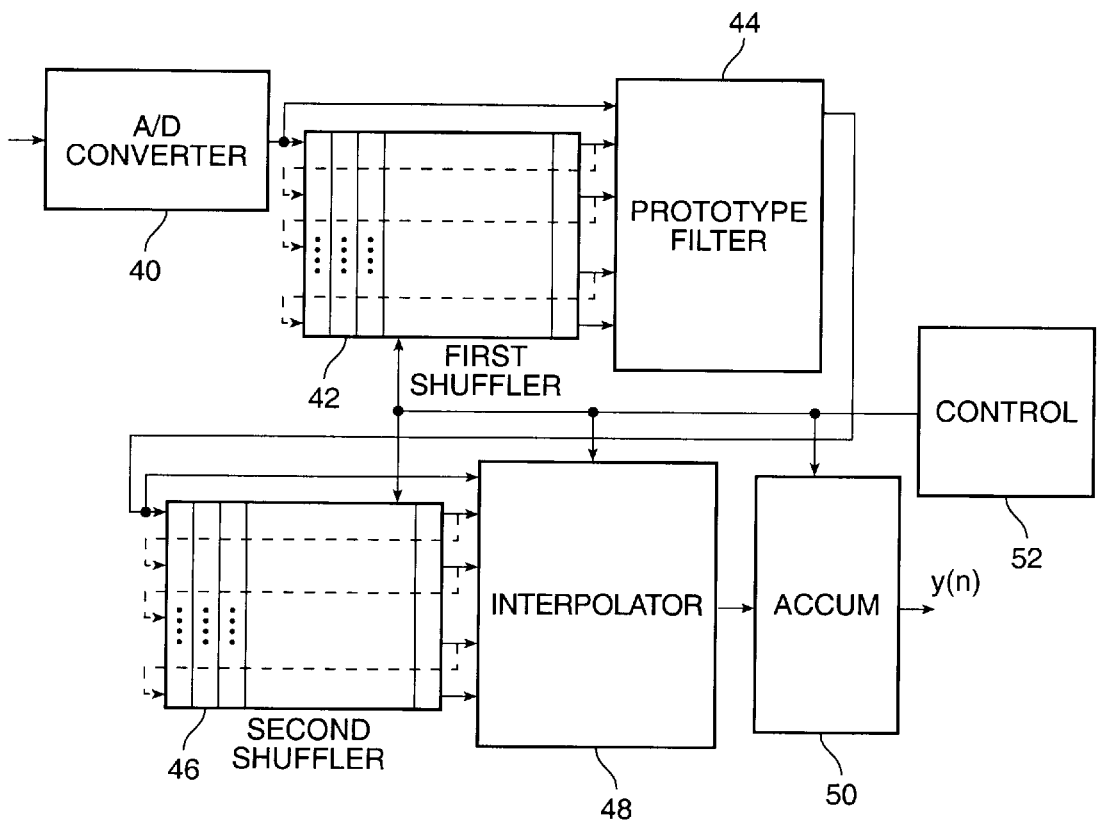
FIG. 5 depicts the apparatus representing the preferred embodiment of the present invention.

The present invention is a single digital filter capable of variable bandwidth filtering which does not suffer from the prior art aliasing problems at low bandwidths. FIG. 5 depicts the preferred embodiment of the invention. A system including the digital filter would include the filter, along with an A/D converter 40 which converts the signal from analog to digital form by sampling the signal at a specific sampling frequency. The signal is then passed to the digital filter.

Within the digital filter, the first shuffler 42 takes the signal 40 and splits it into smaller sequences, each sequence containing different phases of the signal. One embodiment of this shuffler is be a series of levels of delays, each level having more delays than the previous level. However, there are numerous ways to design a shuffler known in the prior art. In fact, since this is an entirely digital system, the shuffler is normally contained on a chip. The advantage of implementing the shuffler digitally is that a parameter M can be passed to it which changes the size of the phases. As explained later, this will allow for scaling of the output of the prototype filter 44.

Figure 1:
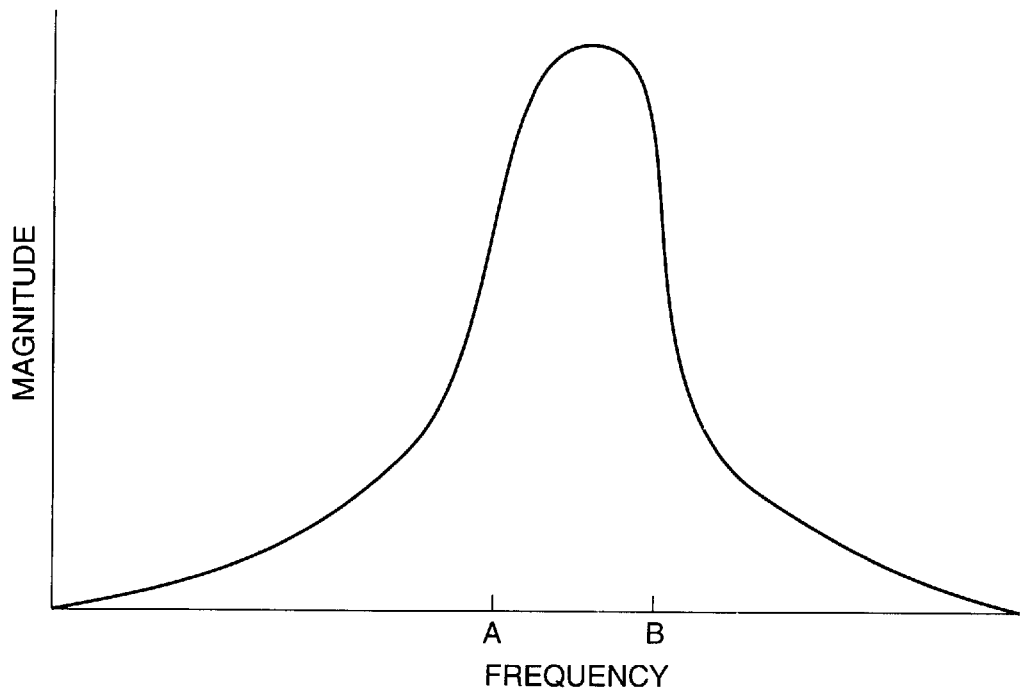
FIG. 1 is an example of a typical signal plotted on a graph of magnitude over frequency.
Figure 2A:
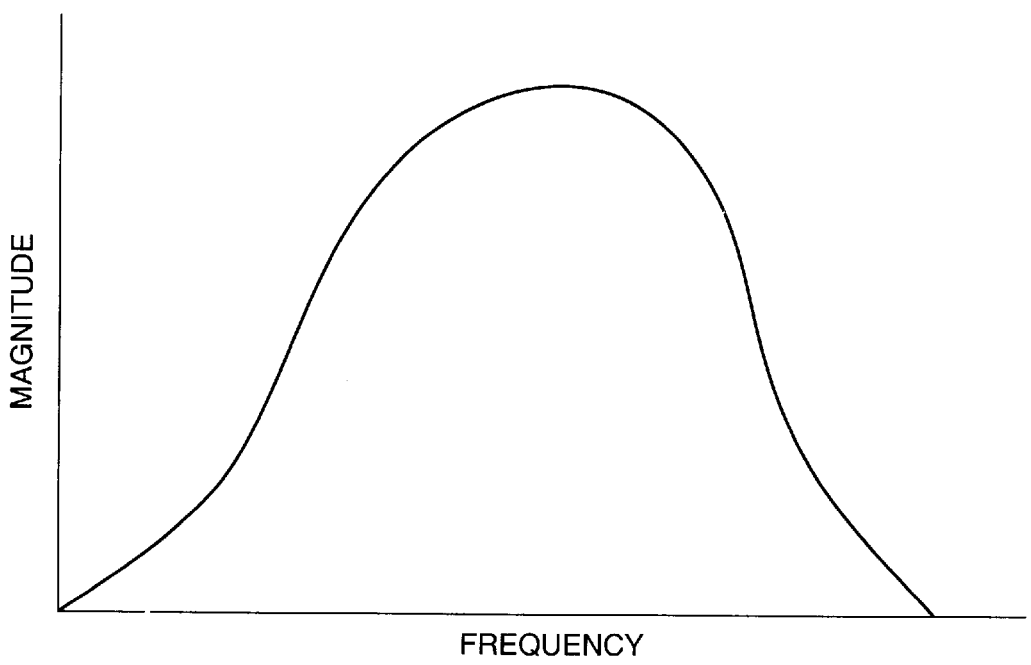
FIG. 2A is an example of the signal in FIG. 1 after it has been passed through one type of prototype filter.
Figure 2B:
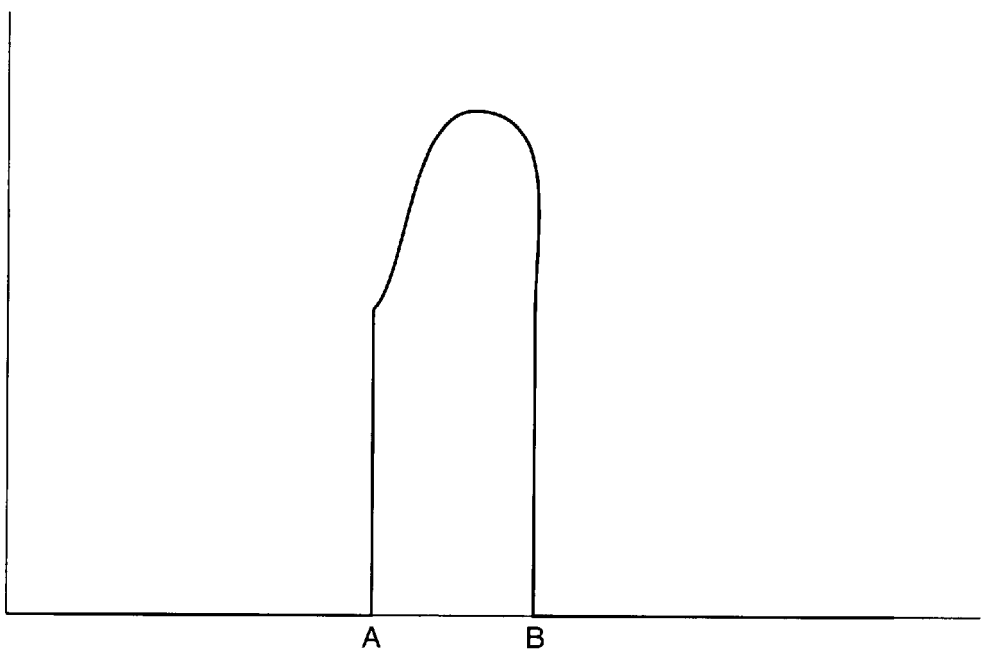
FIG. 2B is an example of the signal in FIG. 1 after it has been passed through a rejection filter.
Figure 2C:
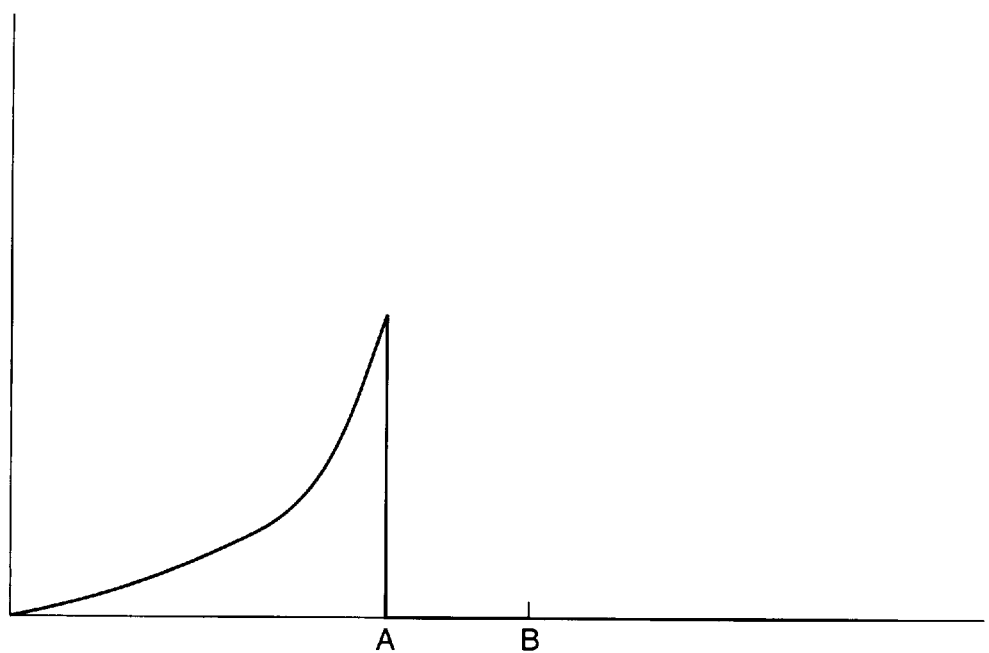
FIG. 2C is an example of the signal in FIG. 1 after it has been passed through a lowpass filter.
Figure 3:
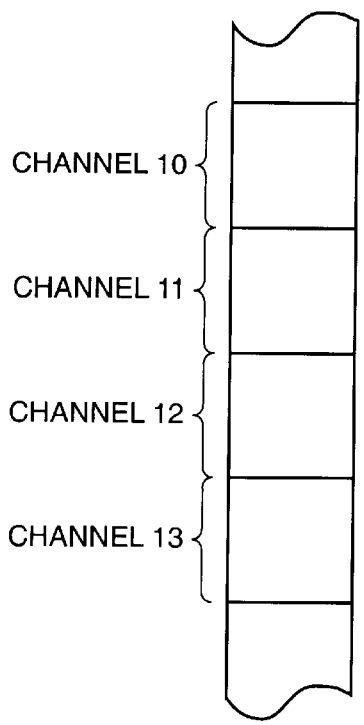
FIG. 3 is an example of the channel spectrum in a system using fixed bandwidth channels.
Figure 4:
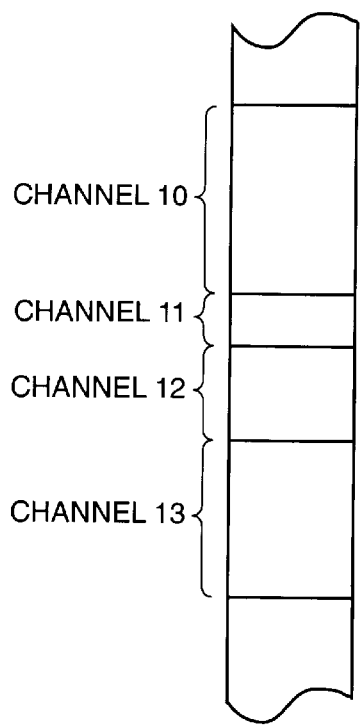
FIG. 4 is an example of the channel spectrum in a system using variable bandwidth channels.

The output of the first shuffler 42 can then be passed through a prototype filter 44. The prototype filter 44 can be any design of filter the user wishes to implement. In a digital implementation, the prototype filter usually takes each of the phases individually, and returns a weighted sum of the numbers in the sequence. The amount each number is weighted is determined by how the user wishes to filter the signal, which is dictated by the structure of the prototype filter 44. Prototype filters are known in the prior art. One example of a prototype filter would be one designed to alter the shape of the voltage-frequency wave (as shown in FIG. 2A). The design of the prototype filter will affect the weighted sums that it outputs, allowing the alteration of the wave. This weighting can be affected by changes in the length or the width of the prototype filter (i.e. the overall structure of the prototype filter). Of course, since the prototype filter is "hardwired", it cannot be modified on the fly. Therefore, in our present example, the specific "shape" of the alteration cannot be altered. However, changes in the parameter M passed to the first shuffler will change the size of the phases, thus scaling of the bandwidth of the prototype filter 44. This can be accomplished using a control mechanism 52 which is coupled to the first shuffler which can then alter the size of the phases. The equivalent bandwidth of the system is the 1/M of the bandwidth of the prototype filter. M can be thought of as the "length" of the first shuffler, even though in the digital world the physical "length" of the shuffler is not determinative. It is also important to remember that the prototype filter can emulate any type of filter and need not alter the "shape" of the signal if the user does not wish.

Another function of the first shuffler 42 is to allow for oversampling. Oversampling occurs when the original analog signal is sampled at a rate higher than the Nyquist rate. This provides for greater resolution of the data. The implementation of the first shuffler 42 allows the user to sample at a high frequency, while still filtering a small bandwidth because the equivalent bandwidth of the entire system is scaled. This flexibility in the sampling frequencies can be very useful in systems where oversampling is desired.

The output of the prototype filter 44 will be a stream of weighted sums (i.e. a stream of numbers). This stream will then be passed through a second shuffler 46. This second shuffler 46 performs a similar function to that of the first shuffler 42. The output of the second shuffler 46 will be a series of sequences of these weighted sums, again grouped by "phase". Like the first shuffler 42, when implemented digitally, the second shuffler 46 can be modified "on the fly" using a control mechanism 52 to alter the phase size. The phase size of the second shuffler 46 need not match the phase size of the first shuffler 42, however, it is often preferable to have matching phase sizes so that the prototype filter and the interpolator-accumulator combination can work as one combined filter, as opposed to working as two separate filters filtering different frequency ranges.

The interpolator 48 then receives this stream of weighted sum sequences and interpolates the data to get an approximation of the particular point in the data stream that the system is interested in. The accumulator 50 then averages this stream of estimations along with the "actual reading" into one single estimate of the value of the point. The resulting output of the accumulator is a stream of data representing the filtered signal. The shuffler-interpolator-accumulator-control mechanism combination implements a polyphase lowpass filters. By allowing a control mechanism 52 to modify the parameters of the second shuffler-interpolator-accumulator combination, the combination can act as a rejection filter capable of filtering multiple bandwidths. Therefore, in a preferred embodiment, a control mechanism 52 is coupled to the second shuffler 46, the interpolator 48, and the accumulator 50.

The combination of the first shuffler 42, prototype filter 44, second shuffler 46, interpolator 48, and accumulator 50 allows for a single digital filter that can perform any type of filtering along with rejection filtering, all on a variable bandwidth signal even at low bandwidths. In addition, since the signal is passed through two separate shufflers which can be modified after manufacture, the filter can handle multiple sampling frequencies and even oversampling without having to alter the structure of the filter. All of these conditions provide for a great amount of flexibility in the filter.

Figure 6:
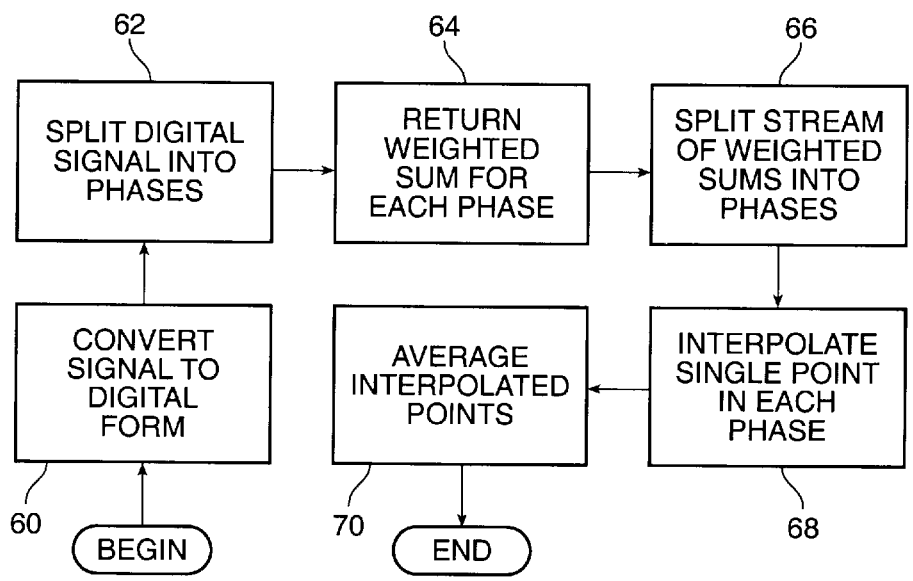
FIG. 6 depicts the method representing the preferred embodiment of the present invention.

The preferred embodiment of the invention can also be represented as a method for digital filtration. Referring to FIG. 6, this method begins at step 60 with converting the input signal to digital form. Then the digital signal can be split into phases at step 62. Each phase is then converted to a single weighted sum at step 64, resulting in a stream of weighted sums (one for each of the phases). At step 66, this stream of weighted sums is split into phases. These phases may be a different size from the phases the digital signal was split into at step 62, but normally it is advantageous to have the same size phases as it allows the filter to work more efficiently.

At step 68, single points in each phase can be interpolated to give a plurality of estimated values at a single point. These estimated values can then be averaged at step 70 to arrive at a single estimated value for a specific point in the spectrum. The interpolation and averaging steps can then be repeated for each point in the signal that the user wishes to include at output, arriving at a series of estimated points which make up the filtered signal.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

I claim:

1. A digital filter including:

a first shuffler having an input and an output;

a prototype filter having an input and an output, said output of said first shuffler coupled to said input of said prototype filter;

a second shuffler having an input and an output, said output of said prototype filter coupled to said input of said second shuffler;

an interpolator having an input and an output, said output of said second shuffler coupled to said input of said interpolator; and an accumulator having an input and an output, said output of said interpolator coupled to said input of said accumulator.

2. The digital filter in claim 1 wherein said first shuffler further includes a second input.

3. The digital filter in claim 2 further including a control mechanism coupled to said second input of said first shuffler.

4. The digital filter in claim 1 wherein said second shuffler further includes a second input.

5. The digital filter in claim 4 further including a control mechanism coupled to said second input of said second shuffler.

6. The digital filter in claim 1 wherein said interpolator further includes a second input.

7. The digital filter in claim 6 further including a control mechanism coupled to said second input of said interpolator.

8. The digital filter in claim 1 wherein said accumulator further includes a second input.

9. The digital filter in claim 8 further including a control mechanism coupled to said second input of said interpolator.

10. A digital filter including:

a first shuffler having a first input, a second input, and an output;

a prototype filter having an input and an output, said output of said first shuffler coupled to said input of said prototype filter;

a second shuffler having a first input, a second input, and an output, said output of said prototype filter coupled to said first input of said second shuffler;

an interpolator having a first input, a second input, and an output, said output of said second shuffler coupled to said first input of said interpolator;

an accumulator having a first input, a second input, and an output, said output of said interpolator coupled to said first input of said accumulator; and a control mechanism with a first output, a second output, a third output, and a fourth output, said first output of said control mechanism coupled to said second input of said first shuffler, said second output of said control mechanism coupled to said second input of said second shuffler, said third output of said control mechanism coupled to said second input of said interpolator, and said fourth output of said control mechanism coupled to said second input of said accumulator.

11. A system for digital filtration comprising:

an A/D converter having an input and an output;

a first shuffler having a first input, a second input, and an output, said output of said A/D converter coupled to said input of said first shuffler;

a prototype filter having an input and an output, said output of said first shuffler coupled to said input of said prototype filter;

a second shuffler having a first input, a second input, and an output, said output of said prototype filter coupled to said first input of said second shuffler;

an interpolator having a first input, a second input, and an output, said output of said second shuffler coupled to said first input of said interpolator;

an accumulator having a first input, a second input, and an output, said output of said interpolator coupled to said first input of said accumulator; and a control mechanism with a first output, a second output, a third output, and a fourth output, said first output of said control mechanism coupled to said second input of said first shuffler, said second output of said control mechanism coupled to said second input of said second shuffler, said third output of said control mechanism coupled to said second input of said interpolator, and said fourth output of said control mechanism coupled to said second input of said accumulator.

12. A method for digital filtration including the steps of:

splitting a signal into phases;

returning a stream of weighted sums including a weighted sum for each of said phases of said signal;

splitting said stream of weighted sums into phases;

returning a stream of points including an interpolated point in each of said phases of said weighted sums; and averaging said interpolated points.

13. The method in claim 12 wherein said splitting a signal into phases step includes the step of using a first shuffler to split said signal into phases.

14. The method in claim 12 wherein said returning a stream of weighted sums step includes the steps of:

using a prototype filter to weight each point in each phrase; and combining said weights for each phase to arrive at a weighted sum.

15. The method in claim 12 wherein said splitting said stream of weighted sums step includes the step of using a second shuffler to split said stream of weighted sums into phases.

16. The method in claim 12 wherein said returning a stream of points step includes the steps of:

receiving commands on which point to interpolate from a control mechanism;

using an interpolator and the data in each of said phases to interpolate an estimate for said point for each of said phases.

17. The method in claim 12 wherein said step of averaging said averaging step includes the step of using an accumulator to average said interpolated points.

18. A method for digital filtration including the steps of:

converting a signal to digital form;

splitting said signal into phases;

returning a stream of weighted sums including a weighted sum for each of said phases of said signal;

splitting said stream of weighted sums into phases;

returning a stream of points including an interpolated point in each of said phases of said weighted sums; and averaging said interpolated points.

19. The method in claim 18 wherein said splitting a signal into phases step includes the step of using a first shuffler to split said signal into phases.

20. The method in claim 18 wherein said returning a stream of weighted sums step includes the steps of:

using a prototype filter to weight each point in each phrase; and combining said weights for each phase to arrive at a weighted sum.

21. The method in claim 18 wherein said splitting said stream of weighted sums step includes the step of using a second shuffler to split said stream of weighted sums into phases.

22. The method in claim 18 wherein said returning a stream of points step includes the steps of:

receiving commands on which point to interpolate from a control mechanism;

using an interpolator and the data in each of said phases to interpolate an estimate for said point for each of said phases.

23. The method in claim 18 wherein said step of averaging said averaging step includes the step of using an accumulator to average said interpolated points.

* * * * *